United States Patent [19]

Yancey

[11] 4,269,652

[45] May 26, 1981

[54] METHOD FOR GROWING CRYSTALLINE MATERIALS

[75] Inventor: Paul J. Yancey, Matthews, N.C.

[73] Assignee: Allied Chemical Corporation, Morris Township, Morris County, N.J.

[21] Appl. No.: 958,089

[22] Filed: Nov. 6, 1978

[51] Int. Cl.³ .............................................. C30B 15/14
[52] U.S. Cl. ................................... 156/607; 156/608; 156/DIG. 61
[58] Field of Search ....... 156/608, DIG. 88, DIG. 61, 156/DIG. 73, 607; 422/246; 164/60; 165/104; 23/245 R, 300, 301

[56] References Cited

U.S. PATENT DOCUMENTS

| | | | |
|---|---|---|---|
| 2,850,372 | 9/1958 | Planiol | 422/246 |
| 3,471,266 | 10/1969 | La Belle | 156/608 |
| 3,591,348 | 7/1971 | La Belle | 156/608 |
| 3,701,636 | 10/1972 | La Belle | 156/608 |
| 3,795,487 | 3/1974 | Tamalet | 165/104 F |
| 3,954,551 | 5/1976 | Cecil et al. | 156/608 |
| 4,090,851 | 5/1978 | Berkman et al. | 156/DIG. 83 |

OTHER PUBLICATIONS

Mat. Res. Bull. v6 No. 7 pp. 571-580 (1971) Pergamon Press.

*Primary Examiner*—Hiram Bernstein
*Attorney, Agent, or Firm*—Jay P. Friedenson

[57] ABSTRACT

Improvement in the method for growing crystalline materials by seed pulling from a melt whereby crystalline product produced is substantially free of voids and/or inclusions which were previously caused by the continuous feeding operation. The improved method comprises feeding the source material through a bed of particulate refractory material whereby entrained gases in the melting feed material are eliminated thereby resulting in a crystalline product which is substantially free of voids and inclusions.

11 Claims, 2 Drawing Figures

METHOD FOR GROWING CRYSTALLINE MATERIALS

BACKGROUND OF THE INVENTION

This invention relates to an improvement in the method for growing crystalline materials by seed pulling from a melt.

The art for growing crystalline materials by seed pulling from a melt is well developed. The art is exemplified by the "Czochralski Crystal Growth Method", the "Stepanov Technique", the "Inverted Stepanov Technique"; "Edge-Defined Film-Fed Growth" (EFG process), and modifications of those techniques.

All of these techniques may comprise providing a liquid reservoir supply of the crystalline material by feeding a supply of the material in solid form to the reservoir and heating the contents of the reservoir to melt the material, contacting a seed with the melt in the reservoir or with melt which is fed from the reservoir by capillary action to the surface of a product-shaping member, and causing said melt to solidify on the seed.

These techniques are well documented in the literature such as in: J. V. Stepanov, *Soviet Physics—Technical Physics*, 29,339 (1959); J. C. Swartz et al, *J. Electronic Materials*, 4,255 (1975); U.S. Pat. Nos. 3,393,054; 4,090,851; 3,591,348; 3,701,636; 3,471,266; 3,527,574; 3,607,112; 3,650,703; 3,687,633; 3,846,082; 3,826,625; 3,765,843 and 3,853,489.

The crystalline materials manufactured by these techniques, such as of alpha-alumina and silicon, have varying utilities such as optical components, photovoltaic devices and as substrates for epitaxially grown semiconductor materials for integrated circuit devices. The latter application has become particularly significant for crystalline bodies grown by the EFG process.

Other crystalline materials which could be manufactured by these techniques include, but are not limited to, doped varieties of white sapphire such as ruby and blue sapphire, any colored form of crystalline yttrium aluminum garnet, both clear and doped, barium titanate and lithium niobate.

With the sophistication of integrated circuit device technology the internal quality of the crystalline bodies which are used as substrates therefor have become important. A problem with all these techniques is the occurrence of microvoids and/or inclusions within the bulk of the crystalline bodies or materials produced. The density of such defects is commonly on the order of 100–1000 per square centimeter when viewed at 100×. When the crystalline product materials are lapped and polished, these defects manifest themselves as pits on the surface of the finished materials, commonly up to 300 per centimeter with the defects ranging in size from 1–25 microns in diameter. Such number and size of defects have become unacceptable for currently produced sophisticated integrated circuit devices.

It is an object of this invention to provide an improvement in the method for growing crystalline material by seed pulling from the melt which substantially eliminates such internal defects from the product produced.

It is another object of this invention to provide an improved method as above described which permits continuous feeding of source material into the crucible or furnace without creating such defects in the product.

Still another object of the invention is to provide an improved process as described above which results in higher yields of higher quality product.

Yet another object of the invention is to provide an improvement in the method for growing crystalline materials by seed pulling from a melt which is capable of substantially eliminating such defects over a wide range of crystal pull rates.

Other objects and advantages of the invention will become apparent from the following description.

SUMMARY OF THE INVENTION

According to the broad process embodiment of the invention, there is provided an improvement in the method of growing crystalline material by seed pulling from a melt which comprises providing and maintaining a liquid reservoir supply of said material by feeding a supply of said material in solid form to said reservoir while melting the contents of the reservoir to form a liquid material, contacting a seed with said liquid material and causing said liquid material to solidify on said seed. The improvement comprises feeding the supply of solid material onto a stationary bed of particulate refractory metal which is in communication with said reservoir whereby said solid material melts in contact with said bed to provide and maintain said liquid reservoir supply.

Apparatus suitable for growing crystalline material by seed pulling from a melt comprises a crucible and furnace for heating a solid supply of said material and an inner container for solid particulate material within said crucible is provided and spaced therefrom which container has one or more openings at the bottom thereof to permit exiting of liquid therethrough to the crucible.

DETAILED DESCRIPTION OF THE INVENTION AND OF THE PREFERRED EMBODIMENTS

In the preferred process embodiment of the invention, the melted or liquid feed material is fed from the reservoir by capillary action to the surface of a product-shaping member to establish a liquid film of said material. The seed is contacted with the liquid fed to the surface of the product-shaping member and the liquid material is caused to solidify on said seed.

Apparatus useful to carry out the preferred process embodiment of the invention includes a product-shaping member disposed in the crucible and a capillary passageway extending from the bottom of the crucible to the top end surface of said product-shaping member.

The following detailed description and examples of the invention are directed to growth of crystalline bodies of alpha-alumina (or sapphire) by the EFG process which is the preferred embodiment. However it is to be understood that the invention is applicable to the other techniques for crystal growth by seed pulling and also to other crystalline materials as previously described, as well as to other materials which will be apparent to persons skilled in this art.

Since the details concerning this technology and techniques for growing crystals by the EFG process are fully explained in detail in the prior art illustrated by the prior art references mentioned above, such conventional details will not be repeated herein, rather the description will be limited to the improvements made.

Figure 1:
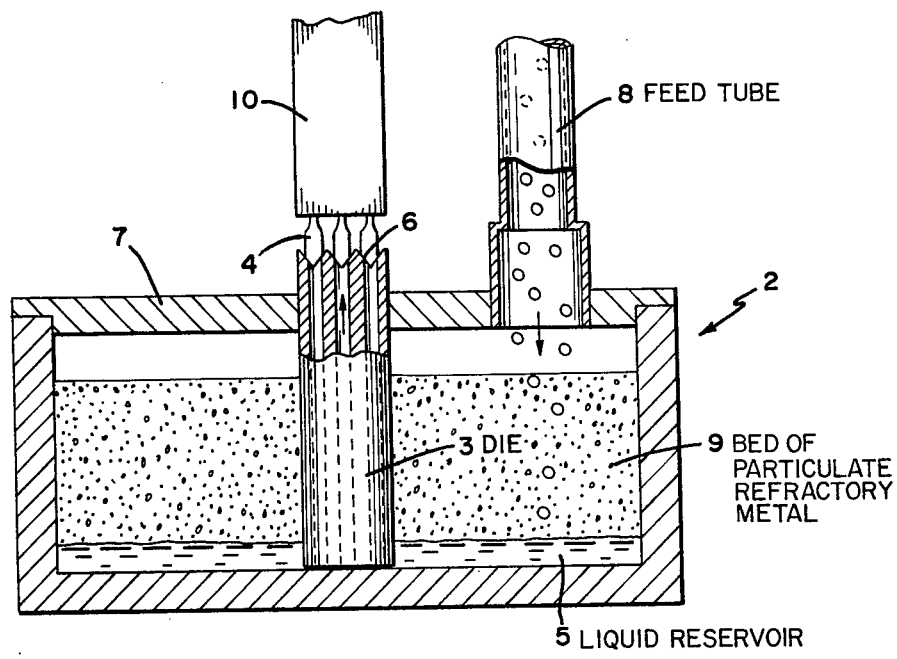
FIG. 1 is a fragmentary elevational view, partially in section, of a crucible suitable for use in carrying out a preferred process embodiment of this invention.

Referring to FIG. 1, a crucible 2 is adapted for use in growing monocrystalline material from a melt by the EFG process. Product-forming member or die 3 (shown in the drawing as a multiple ribbon die assembly) is mounted within the furnace and has disposed therein capillary passageways 4 for feeding liquid material from liquid reservoir 5 in crucible 2 to the upper surface 6 of the die 3. Crucible lid 7 supports die 3 which lid also supports a feed tube 8. The crucible is heated by a radio frequency coil (not shown) of conventional construction powered by a 10 KHZ/motor generator. A conventional crystal pulling mechanism (not shown) is provided for pulling the crystal seed. A bed 9 of particulate refractory metal is provided in the crucible in communication with the reservoir 5.

In operation, the crucible is heated to the desired temperature at which time the feed material is introduced through feed tube 8 onto the bed of particulate refractory metal 9. A reservoir of the melt accumulates and the melt fills the dies in die assembly 3 by capillary action. A seed ribbon 10 is lowered to contact the melt in the dies. A liquid film of the melt is established on the surface of the die assembly and the liquid on the surface is caused to solidify on the surface of the seed by conventional means, such as by controlling the temperature of the system and/or by controlling the rate of withdrawal of the seed.

Any refractory metal or refractory metal compound having a melting point higher than the feed material may be used as the particulate refractory metal for bed 9 in accordance with the invention. Such particulate refractory metal should, of course, be compatible with the feed material. Illustrative suitable refractory metals for this purpose include tungsten (W), molybdenum (Mo), tantalum (Ta), iridium (Ir), rhenium (Rh), columbium (Cm) and osmium (Os). Alloys of these metals are also suitable of which tungsten/molybdenum and tungsten/rhenium alloys are illustrative. The preferred refractory metals are W and Mo, with Mo being especially preferred.

The size of the particulate refractory metal is not absolutely critical but size is important in order to maximize the benefits according to the present invention. If the particles are too large, there could be a sacrifice in the number of defects screened out. If the particles are too small handling problems will result. Generally the particle size range for the refractory metal should be between about −4 to about +40 mesh (U.S. Standard) and preferably between about −8 to about +40 mesh.

Figure 2:
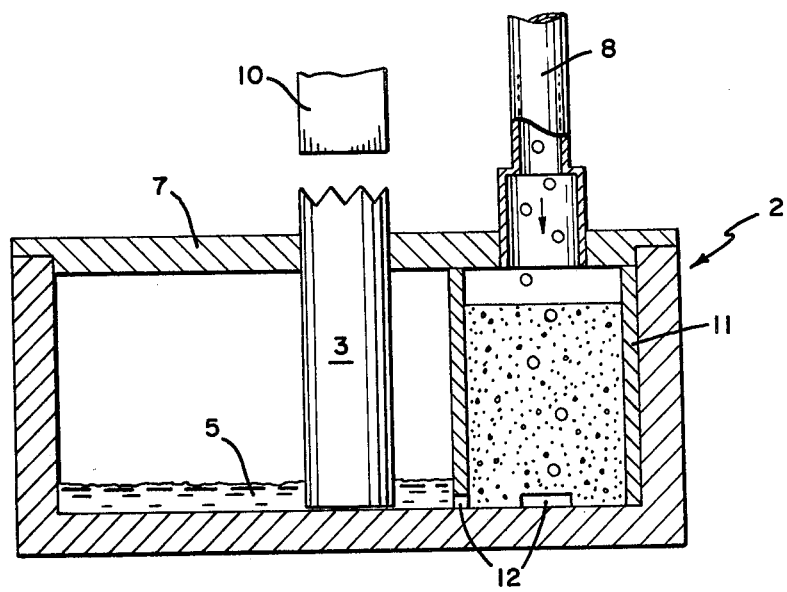
FIG. 2 is a fragmentary elevational view, partially in section, of a modified crucible suitable for use in carrying out a preferred process embodiment of this invention.

The bed of particulate refractory material may be merely maintained as a layer at the bottom of the crucible or, as in the preferred apparatus embodiment shown in FIG. 2, it may be provided within an inner container 11 within crucible 2 and spaced therefrom which container 11 has one or more openings 12 at the bottom thereof to permit exiting of molten material therethrough to replenish the melt in reservoir 5. It has been found that with this embodiment an exceptionally high quality product is obtained.

The bed of particulate refractory metal acts as a premelting stage for the source material, eliminates splashing into the liquid reservoir and provides a high surface area screen for the elimination of bubbles in the melt. In the process of the melt seeping through the particulate refractory metal bed, the entrained gases are eliminated from the liquid and the reservoir established and maintained at the crucible bottom is thus free of bubbles. The result is that the crystalline products which are grown as a result of this process and with the apparatus described are essentially free of voids and/or inclusions which were previously caused by the continuous feeding operation of the prior art which did not employ such a particulate refractory metal bed.

The process of the invention is effective in substantially reducing such voids and defects over a wide range of crystal pulling rates which is particularly advantageous for commercial operation.

The following examples show comparative crystal pulling runs employed with and without use of the particulate refractory metal bed in accordance with the invention.

Example 1 demonstrates the results obtained without employing the particulate refractory metal bed according to the invention.

Example 2 demonstrates the results obtained with the benefit of the invention process in the embodiment of FIG. 1.

EXAMPLE 1

A molybdenum crucible was fitted with a multiple ribbon die assembly held down by a molybdenum lid which also supports a molybdenum feed tube as shown in FIG. 1. The volume of the crucible was left open. This entire assembly was installed in a vertical graphite furnace inductively heated by a 10 KHz motor generator. The crucible assembly was heated to a temperature of approximately 2100° C. at which time granular aluminum oxide feed material (sapphire) −8 to +20 mesh was introduced into the system through a ceramic feed tube until sufficient material melted to allow capillary action to fill the dies in the die assembly. An oriented sapphire seed ribbon was lowered slowly to a point just above the multiple die assembly. After sufficient time for temperature stabilization, the seed was lowered at 1 inch/hour to contact the molten sapphire in the dies. The seed was then slowly withdrawn at 1 inch/hour while the temperature of the system was lowered approximately 80° C. to initiate horizontal spreading of the new crystalline material on the seed. As soon as the ribbons spread across the dies, the temperature was increased approximately 30° C., the pull rate was increased to 4 inches/hour, and feed material was introduced into the system thru the feed tube at a rate equal to the rate of withdrawal of sapphire from the crucible through pulling the ribbon. Three sapphire ribbons were pulled simultaneously to a length of 6.2 inches under the above conditions. At the above length the feed material introduction was stopped, the pull was stopped and the ribbons were separated from the dies by a very short pulse of a high speed pull rate of approximately 20 inches/minute. The ribbons were then slowly raised at 20 inches/hour until they emerged from the crucible. After removal from the seed, the ribbons were inspected for internal defects by microscopic examination at 100× with transmitted light. The internal microvoid and defect density at the center of the ribbon thickness was approximately 500 defects per field of view or 20,000/cm$^2$. Defect size ranged from a few microns to 100 microns with most of the defects in the 25–50 micron range.

EXAMPLE 2

The inside volume of the crucible in the apparatus described in FIG. 1. was filled to within ½ inch of of the lid with molybdenum chips of approximately −8 mesh. The crystal growing process was then repeated precisely as described in Example 1. The resulting product contained a marked improvement in internal ribbon defect density. The defect density of this ribbon ranged from 50–100 defects per field of view for most views, and in some cases dropped to less than 10 defects per field of view at 100×. The size distribution became more uniform with most defects in the 10–50 micron range.

EXAMPLE 3

The process of Example 2 was repeated except that the apparatus modification of FIG. 2 was employed. The apparatus modification comprised use of a thin walled tubular container to hold the molybdenum chips. The diameter of the tubular container was approximately ⅓ the inside diameter of the crucible and as high as the internal depth under the lid. It was filled with −8 mesh molybdenum chips leaving approximately ¼" freeboard at the top. The bottom of the tube had shallow but wide slots to allow the liquid sapphire to exit the tube to the open volume. The filled tube was positioned directly under the feed tube. Granular sapphire fell through the feed tube, melting on top of the chips. The molten sapphire percolated down through the packed bed evolving as filtered liquid, free of gas bubbles. The ribbons grown contained very few, if any, defects in the central volume of the entire ribbon. No defects were detected at 100×.

I claim:

1. In the method of growing crystalline material from a melt comprising providing and maintaining a liquid reservoir supply of said material by feeding a supply of said material in solid form to said reservoir while melting the contents of the reservoir to form a liquid material, contacting a seed with said liquid material and causing said liquid material to solidify on said seed; the improvement which comprises feeding the supply of solid material onto a stationary bed of particulate refractory metal which is in communication with said reservoir whereby said solid material melts in contact with said bed to provide and maintain said liquid reservoir supply.

2. The process according to claim 1 in which said liquid material is fed from said reservoir by capillary action to the surface of a product-shaping member to establish a liquid film of said material in which the seed is contacted with the liquid material fed to the surface of the product-shaping member.

3. The process according to claim 2 in which the crystalline material is sapphire.

4. The process according to claim 2 in which the particulate refractory metal is selected from the group consisting of W, Mo, Ta, Ir, Rh and alloys thereof.

5. The process according to claim 2 in which the refractory metal is W.

6. The process according to claim 2 in which the refractory metal is Mo.

7. The process according to claim 2 in which the size of the particulate refractory metal is from about −4 to about +40 mesh.

8. The process according to claim 2 in which the size of the particulate refractory metal is from about −8 to about +40 mesh.

9. The process according to claim 2 in which the crystalline material is sapphire.

10. The process according to claim 9 in which the particulate refractory metal is selected from W and Mo.

11. The process according to claim 10 in which the particulate refractory metal is Mo.

* * * * *